United States Patent
Agrawal et al.

(10) Patent No.: US 7,260,700 B2
(45) Date of Patent: Aug. 21, 2007

(54) METHOD AND APPARATUS FOR SEPARATING NATIVE, FUNCTIONAL AND TEST CONFIGURATIONS OF MEMORY

(75) Inventors: Ghasi R. Agrawal, Sunnyvale, CA (US); Willie K. Chan, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 367 days.

(21) Appl. No.: 10/954,708

(22) Filed: Sep. 30, 2004

(65) Prior Publication Data

US 2006/0085701 A1   Apr. 20, 2006

(51) Int. Cl.
*G06F 12/00* (2006.01)
(52) U.S. Cl. .................................................. 711/170
(58) Field of Classification Search ............ 711/170, 711/172; 713/100
See application file for complete search history.

(56) References Cited

U.S. PATENT DOCUMENTS 5,963,488 A * 10/1999 Inoue ......................... 365/200
6,046,923 A * 4/2000 Evans ......................... 365/49

* cited by examiner

Primary Examiner—Hiep T. Nguyen
(74) Attorney, Agent, or Firm—Suiter Swantz PC LLO

(57) ABSTRACT

A method for allowing native, functional, and test configurations of a memory to be independent of one another includes steps as follows. A memory is first provided. The memory has a native configuration including k words and n data output pins, k and n being positive integers. Each of the k words has a width of n bits. Then the n data output pins are connected to a programmable multiplexer for multiplexing the n data output pins into at least one group of data output pins of the programmable multiplexer. Each of the at least one group of data output pins has no more than n data output pins and is suitable for enabling the memory to have at least one of a test configuration or a functional configuration. At user's discretion, the test configuration may or may not have a width of n bits, the functional configuration may or may not have a width of n bits, and the test configuration and the functional configuration may or may not have the same width.

17 Claims, 4 Drawing Sheets

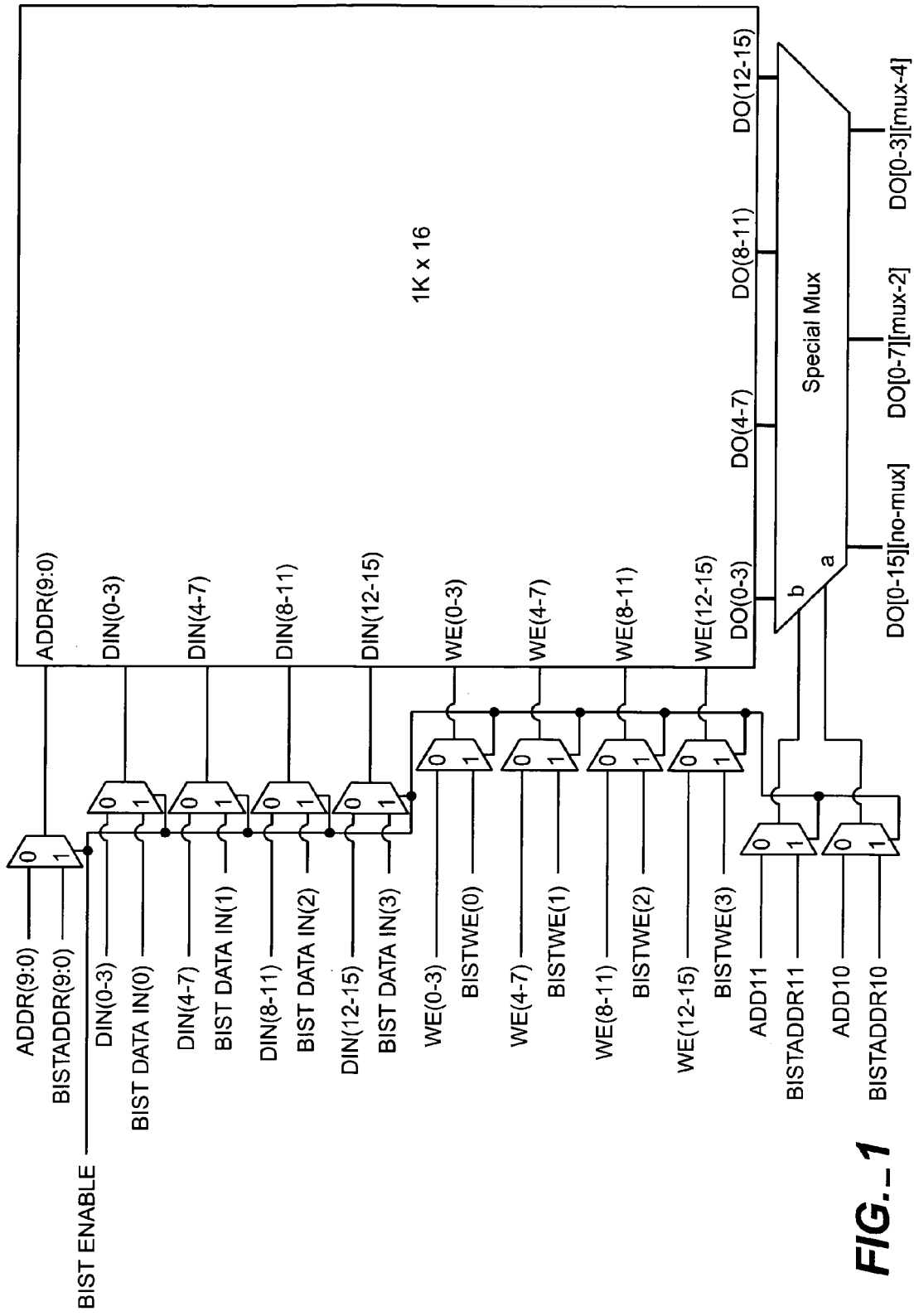
FIG._1

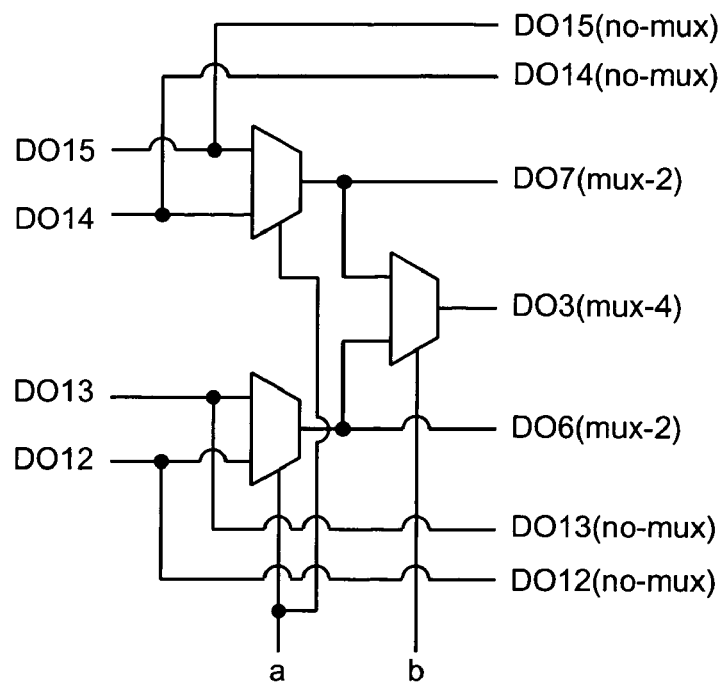
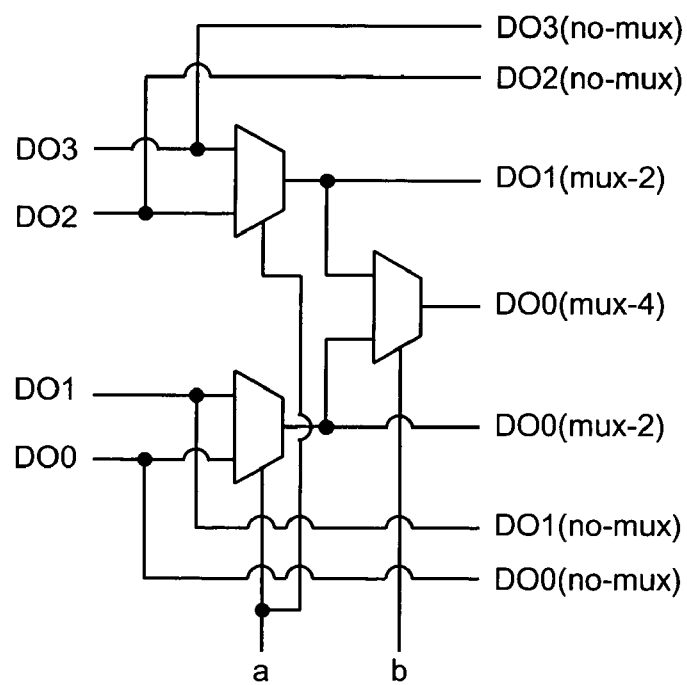
FIG._2

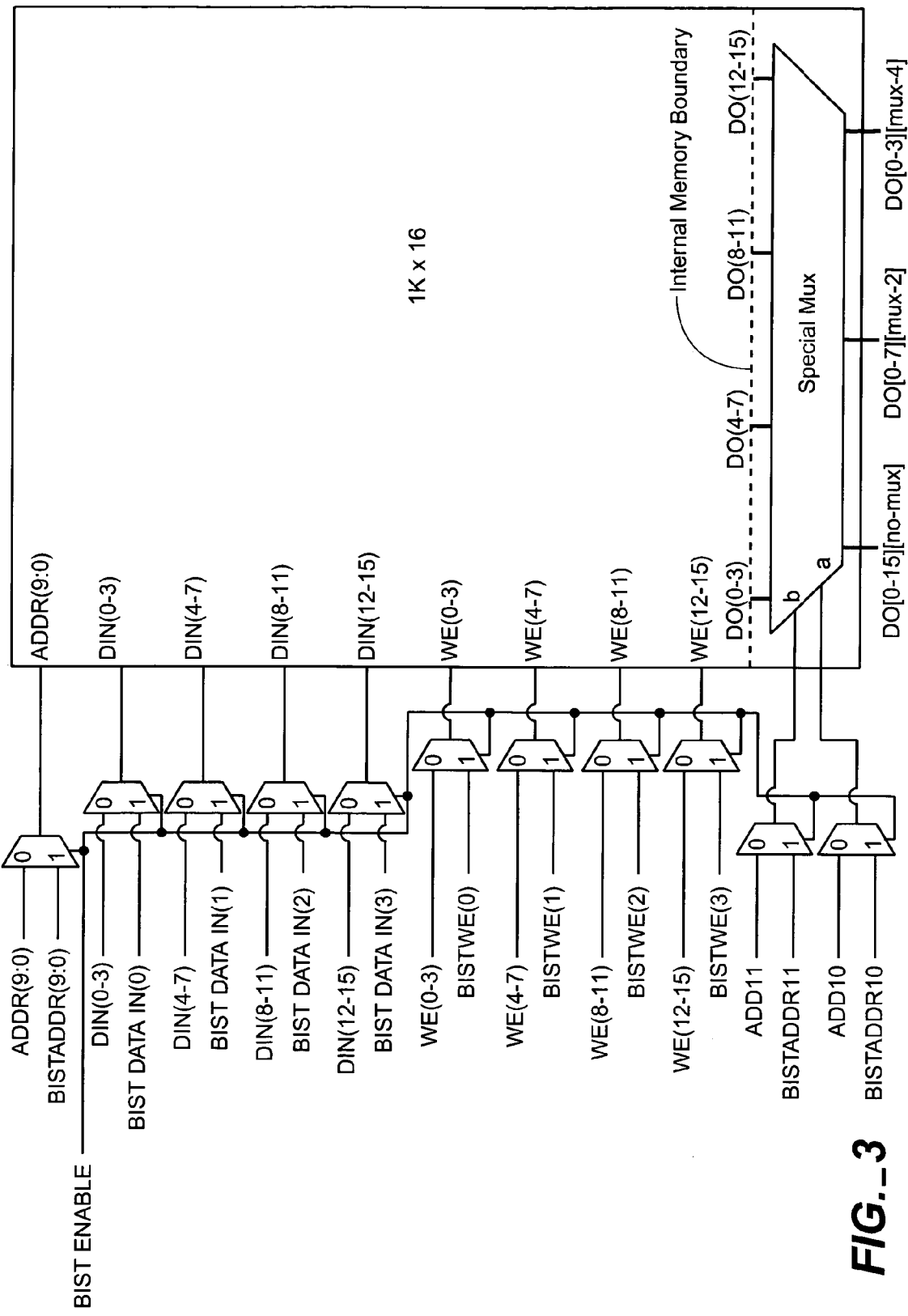
FIG._3

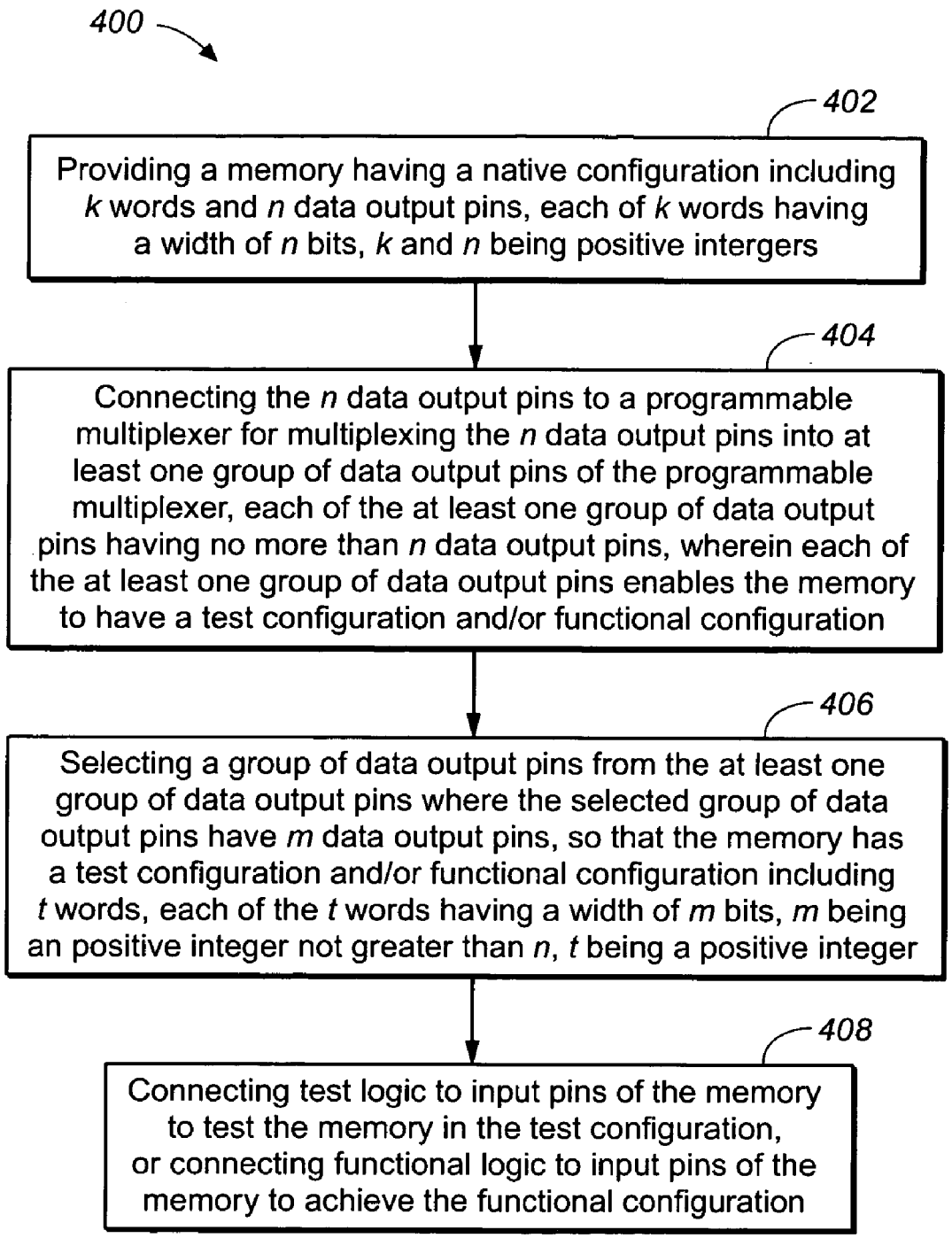
FIG._4

METHOD AND APPARATUS FOR SEPARATING NATIVE, FUNCTIONAL AND TEST CONFIGURATIONS OF MEMORY

FIELD OF THE INVENTION

This invention relates generally to memories, and particularly to a method and apparatus for separating native, functional and test configurations of a memory.

BACKGROUND OF THE INVENTION

In semiconductor devices such as RapidChip™ developed by LSI Logic Corp., and FPGAs (Field Programmable Gate Arrays), it is often desired to provide flexibility to change the size of a memory and also reduce the overall test cost of the memory without adding significant performance penalty and area. Conventionally, this is performed using external muxing (i.e., multiplexing) in standard cells. However, there is no scheme available to reduce the test overhead. In addition, external muxing in standard cells is not acceptable because it takes a significant area and causes significant performance penalty. Moreover, the cost of BIST (Built-In Self-Test) per memory is also significant because the memory sizes themselves are kept very small and wide to support a wide range of configurations. This also creates an inefficient test organization and implementation.

Thus, it is desirable to have a method and apparatus to provide flexibility in memories and also reduce the overall test cost without adding significant performance penalty and area.

SUMMARY OF THE INVENTION

In an exemplary aspect of the present invention, a method for allowing native, functional, and test configurations of a memory to be independent of one another includes steps as follows. A memory is first provided. The memory may include a native configuration with k words and n data output pins, k and n being positive integers. Each of the k words has a width of n bits. Then the n data output pins are connected to a programmable multiplexer for multiplexing the n data output pins into at least one group of data output pins of the programmable multiplexer. Each of the at least one group of data output pins has no more than n data output pins and is suitable for enabling the memory to have at least one of a test configuration or a functional configuration. At user's discretion, the test configuration may or may not have a width of n bits, the functional configuration may or may not have a width of n bits, and the test configuration and the functional configuration may or may not have the same width.

In an additional exemplary aspect of the present invention, a programmable multiplexer for multiplexing n data output pins of a memory into at least one group of data output pins of the programmable multiplexer, where each of the at least one group of data output pins has no more than n data output pins and n is a positive integer, includes a set of multiplexers for connecting to the n data output pins of the memory. Each of the set of multiplexers has a data output pin connected to a data output pin of a group of data output pins of the programmable multiplexer. The group of data output pins of the programmable multiplexer includes m data output pins, m being a positive integer not greater than n. The group of data output pins of the programmable multiplexer is suitable for enabling the memory to have at least one of a test configuration or a functional configuration including a width of m bits.

In another exemplary aspect of the present invention, a system includes a memory having n data output pins in a native configuration and a programmable multiplexer for multiplexing the n data output pins of the memory into at least one group of data output pins of the programmable multiplexer, n being a positive integer. Each of the at least one group of data output pins has no more than n data output pins. The programmable multiplexer includes a set of multiplexers for connecting to the n data output pins of the memory. Each of the set of multiplexers has a data output pin connected to a data output pin of a group of data output pins of the programmable multiplexer. The group of data output pins of the programmable multiplexer includes m data output pins, m being a positive integer not greater than n. The group of data output pins of the programmable multiplexer is suitable for enabling the memory to have at least one of a test configuration or a functional configuration including a width of m bits.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 shows an external muxing scheme using a special mux in accordance with an exemplary embodiment of the present invention;

FIG. 2 illustrates the special mux shown in FIG. 1 in accordance with an exemplary embodiment of the present invention;

FIG. 3 shows an internal muxing scheme using the special mux of FIG. 2 in accordance with an exemplary embodiment of the present invention; and FIG. 4 is a flowchart of a method for separating native, functional and test configurations of a memory in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

The present invention relates to flexibility and configurability in memories and provides a novel architecture which allows native, functional, and test configurations of a particular memory to be independent of one another using programmable external or internal muxing. The present invention defines native, functional and test configurations as follows:

Native Configuration: the configuration the memory is diffused in silicon;

Functional Configuration: the configuration the designer wishes to utilize the memory; and Test Configuration: the configuration interfaced by the memory test logic.

Conventionally, these three configurations are the same, and this notion has worked well for custom designs. However, as customers require more and more reusable platforms such as FPGAs and platform ASICs (Application Specific Integrated Circuits), and as memories (and test overhead) have become an increasing percentage of SOC (System-On-Chip) designs, it is time to change this notion.

According to the present invention, while the total memory capacity of a given instance remains fixed, test and functional configurations need not be identical. The present invention provides a programmable multiplexer (shown as Special Mux in FIGS. 1 and 3) such that a user may connect its test logic to the memory in its native configuration (in this case 1 k×16), muxed by 2 (2 k×8), or muxed by 4 (4 k×4). The test logic may be connected to the appropriate pins for the optimum memory configuration to minimize memory test overhead. Those of ordinary skill in the art will understand that additional mux options may be added as desired without departing from the scope and spirit of the present invention.

Considering current state of the art memory test techniques, it is widely known that test overhead (area) is directly related to the width of the memory and the number of words in the memory do not make significant difference. By reducing the width of the memory and thus changing the size of the memory for test purpose only, the test overhead may be significantly reduced without adding any complexity in the flow or integration of the memory. Muxing of Data Output may be done in such a way that it does not affect the fault coverage of the BIST by changing the way BIST creates logical to physical mapping. The present method may also improve time to completion for designs with a high number of memories as the memory test implementation effort may be shared over multiple instantiations. The present invention may require different Data Output muxing options depending on the memory's native word-width. It is understood that the Special Mux may be used to configure the memory for functional purpose by controlling address pins ADD11 and ADD10 (see FIG. 1).

Designers using the present architecture may also desire to combine two or more of these memories of similar or different sizes to create a larger memory while at the same time wishing to minimize the performance impact associated with aggregating multiple memories. Since the Special Mux has been designed specially to minimize the timing and area impact, the Special Mux may help achieve the overall goal of configuration independence (native, functional, test) with the minimum amount of performance penalty.

It is understood that a multiplexer may be used to select between the test and functional inputs and fed to match the inputs of the native memory configuration. When determining the test configuration according to the present invention, the width of the test data output must be equal to the width of the test data input. Since the test input width may be less than the native width, the test inputs need to be applied to one or more native memory inputs. For example in FIG. 1, assume that the multiplexers feeding the inputs indicate that the 1 k×16 native configuration may be tested as a 4 k×4. To achieve this, one BIST DATA IN may be fed to four native DIN multiplexers. Additionally, the corresponding BISTWE may be fed to the four native WE multiplexers corresponding to the four native DIN pins. A BIST ENABLE signal applied to the select pin of all input multiplexers is used to select between test and functional inputs to the native memory. The actual grouping of the native DIN pins associated with a single TEST DATA IN pin may be adjusted to achieve a desired test pattern so long as the BISTWE associated with the TEST DATA IN pin is also grouped with the corresponding write enable pins of native memory.

FIG. 2 shows an example of implementation of this Special Mux (i.e., programmable multiplexer) for 1 k×16 memory in accordance with an exemplary aspect of the present invention. In this example, a regular 2-input multiplexer has been shown to mux 4 Data Out pins into 1 Data Out pin or 2 Data Out pins. However, this may be designed with any special circuit to minimize the performance penalty and area. As shown in FIG. 2, the programmable multiplexer includes a first set of multiplexers (each connected to the address pin a of the programmable multiplexer) connected to 16 data output pins (i.e., DO0 through DO15) of the 1 k×16 memory. Each of the first set of multiplexers has a data output pin connected to a data output pin of a first group of data output pins (i.e., DO0 (mux-2) through DO7 (mux-2)) of the programmable multiplexer. The first group of data output pins includes 8 data output pins (i.e., DO0 (mux-2) through DO7 (mux-2)) and is suitable for enabling the 1 k×16 memory to have a test and/or functional configuration including a width of 8 bits. The programmable multiplexer further includes a second set of multiplexers (each connected to the address pin b of the programmable multiplexer) connected to data output pins (i.e., DO0 (mux-2) through DO7 (mux-2)) of the first set of multiplexers. Each of the second set of multiplexers has a data output pin connected to a data output pin of a second group of data output pins (i.e., DO0 (mux-4) through DO3 (mux-4)) of the programmable multiplexer. The second group of data output pins includes 4 data output pins (i.e., DO0 (mux-4) through DO3 (mux-4)) and is suitable for enabling the 1 k×16 memory to have a test configuration and/or a functional configuration including a width of 4 bits.

The present programmable multiplexer architecture may be added to any memory for any technology even after the memory has been designed already. This not only helps a user to use already proven memory for his design, but also helps minimize the time for integrating BIST because fewer BIST configurations need to be generated with this programmable multiplexer.

There may be some impact of adding the programmable multiplexer externally because the programmable multiplexer may have to duplicate the buffers which are built inside the memory to drive the load external to the memory. This may be eliminated by including this programmable multiplexer inside the memory so that a user may use most of the circuitry which is already existing inside the memory. This may not only minimize the performance penalty but also reduce the area overhead compared to the external mux scheme. Another potential use of including the mux internal to the memory is to reduce the power consumption by turning off the IO (input/output) and driver circuitry inside the memory based on the status of the programmable multiplexer control pins. FIG. 3 shows an internal muxing scheme using the special mux of FIG. 2 in accordance with an exemplary embodiment of the present invention. As shown, the programmable multiplexer is incorporated inside the memory (at some internal boundary) to minimize the performance impact and area overhead further.

FIG. 4 is a flowchart of a method 400 for separating native, functional and test configurations of a memory in accordance with an exemplary embodiment of the present invention. The method 400 starts with step 402 in which a memory is first provided. The memory may be SRAM (Static RAM), MRAM (Magnetoresistive RAM), FeRAM (Ferroelectric RAM), DRAM (Dynamic RAM), SDRAM (Synchronous DRAM), ROM, EPROM, EEPROM, or the like. The memory has a native configuration including k words and n data output pins, k and n being positive integers. Each of the k words has a width of n bits.

In step 404, the n data output pins are connected to a programmable multiplexer for multiplexing the n data output pins into at least one group of data output pins of the programmable multiplexer. In one embodiment, the programmable multiplexer is external to the memory. Alternatively, the programmable multiplexer is inside the memory. Each of the at least one group of data output pins has no more than n data output pins and is suitable for enabling the memory to have at least one of a test configuration or a functional configuration. At user's discretion, the test configuration may or may not have a width of n bits, the functional configuration may or may not have a width of n bits, and the test configuration and the functional configuration may or may not have the same width.

In step 406, a group of data output pins is selected from the at least one group of data output pins. The selected group of data output pins has m data output pins so that the memory has a test configuration and/or a functional configuration including t words, t being a positive integer. Each of the t words has a width of m bits, m being a positive integer not greater than n. In one embodiment, n is equal to 8, and m is 8, 4 or 2. In an additional embodiment, n is equal to 16, and m is 16, 8, 4 or 2. In another embodiment, n is equal to 32, and m is 32, 16, 8, 4 or 2. In a further embodiment, n is equal to 64, and m is 64, 32, 16, 8, 4 or 2. Those of ordinary skill in the art will understand that other values of n and m may be used without departing from the scope and spirit of the present invention.

In step 408, test logic may be connected to input pins of the memory to test the memory in the test configuration, or functional logic may be connected to input pins of the memory to achieve the functional configuration.

In an alternative embodiment, instead of implementing the steps 406 and 408, the method 400 may, following the step 404, proceed as follows. At least one address pin of the programmable multiplexer is used to enable the memory to have a functional or test configuration including f words, f being a positive integer. Each of the f words has a width of p bits, p being a positive integer not greater than n. In one embodiment, n is equal to 8, and p is 8, 4 or 2. In an additional embodiment, n is equal to 16, and p is 16, 8, 4 or 2. In another embodiment, n is equal to 32, and p is 32, 16, 8, 4 or 2. In a further embodiment, n is equal to 64, and p is 64, 32, 16, 8, 4 or 2. Those of ordinary skill in the art will understand that other values of n and p may be used without departing from the scope and spirit of the present invention.

The present invention may be used in any memory design to minimize the design cycle and may be applied to memories (e.g., SRAM, MRAM, FeRAM, DRAM, SDRAM, ROM, EPROM, EEPROM, or the like) or interfaces to such memories.

The present invention may provide the following advantages. First, the present invention may minimize test overhead by modifying the test configuration to minimize test logic overhead. In addition, the present invention may provide an easier way to change the size of the memory for functional purposes. Moreover, the present invention may reduce the area, performance impact and power overhead required to perform muxing to modify the size of the memory. Furthermore, the present invention may minimize the turn around time of a design by avoiding design of different test logic conventionally required for different memories. Additionally, the present invention may minimize time to market of FPGAs, platform ASICs, and custom SOC integrated circuits by allowing consolidation of similar size memories that may be of different functional configurations into one BIST controller.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for allowing native, functional, and test configurations of a memory to be independent of one another, comprising:
    providing a memory having a native configuration including k words and n data output pins, each of said k words having a width of n bits, k and n being positive integers;
    connecting said n data output pins to a programmable multiplexer for multiplexing said n data output pins into at least one group of data output pins of said programmable multiplexer, each of said at least one group of data output pins having no more than n data output pins and being suitable for enabling said memory to have at least one of a test configuration or a functional configuration; and
    selecting a group of data output pins from said at least one group of data output pins where said selected group of data output pins have m data output pins, so that said memory has a test configuration including t words, each of said t words having a width of m bits, m being an positive integer not greater than n, t being a positive integer; and
    connecting test logic to input pins of said memory to test said memory in said test configuration.

2. The method of claim 1, wherein n is equal to 8, and m is 8, 4 or 2.

3. The method of claim 1, wherein n is equal to 16, and m is 16, 8, 4 or 2.

4. The method of claim 1, wherein n is equal to 32, and m is 32, 16, 8, 4 or 2.

5. The method of claim 1, wherein n is equal to 64, and m is 64, 32, 16, 8, 4 or 2.

6. The method of claim 1, wherein said memory is SRAM, MRAM, FeRAM, DRAM, SDRAM, ROM, EPROM or EEPROM.

7. The method of claim 1, wherein said programmable multiplexer is external to said memory.

8. The method of claim 1, wherein said programmable multiplexer is inside said memory.

9. The method of claim 1, further comprises using at least one address pin of said programmable multiplexer to enable said memory to have a functional or test configuration including f words, each of said f words having a width of p bits, p being a positive integer not greater than n, f being a positive integer.

10. A programmable multiplexer for multiplexing n data output pins of a memory into at least one group of data output pins of said programmable multiplexer, each of said at least one group of data output pins having no more than n data output pins, n being a positive integer, comprising:

a first set of multiplexers for connecting to said n data output pins of said memory, each of said first set of multiplexers having a data output pin connected to a data output pin of a first group of data output pins of said programmable multiplexer, said first group of data output pins including m data output pins, m being an positive integer not greater than n; and a second set of multiplexers for connecting to data output pins of said first set of multiplexers, each of said second set of multiplexers having a data output pin connected to a data output pin of a second group of data output pins of said programmable multiplexer, said second group of data output pins including a data output pins, a being a positive integer not greater than m, wherein said first group of data output pins is suitable for enabling said memory to have at least one of a test configuration or a functional configuration including a width of m bits, said second group of data output pins is suitable for enabling said memory to have at least one of a test configuration or a functional configuration including a width of q bits.

11. The programmable multiplexer of claim 10, wherein said programmable multiplexer is external to said memory.

12. The programmable multiplexer of claim 10, wherein said programmable multiplexer is inside said memory.

13. The programmable multiplexer of claim 10, wherein said memory is SRAM, MRAM, FeRAM, DRAM, SDRAM, ROM, EPROM or BEPROM.

14. A system, comprising:

a memory including n data output pins in a native configuration; and a programmable multiplexer for multiplexing said n data output pins of said memory into at least one group of data output pins of said programmable multiplexer, each of said at least one group of data output pins having not more than n data output pins, n being a positive integer, said programmable multiplexer comprising:

a first set of multiplexers for connecting to said n data output pins of said memory, each of said first set of multiplexers having a data output pin connected to a data output pin of a first group of data output pins of said programmable multiplexer, said first group of data output pins including m data output pins, m being a positive integer not greater than n; and a second set of multiplexers for connecting to data output pins of said first set of multiplexers, each of said second set of multiplexers having a data output pin connected to a data output pin of a second group of data output pins of said programmable multiplexer, said second group of data output pins including a data output pins, a being a positive integer not greater than m, wherein said first group of data output pins is suitable for enabling said memory to have at least one of a test configuration or a functional configuration including a width of m bits, said second group of data output pins is suitable for enabling said memory to have at least one of a test configuration or a functional configuration including a width of q bits.

15. The system of claim 14, wherein said programmable multiplexer is external to said memory.

16. The system of claim 14, wherein said programmable multiplexer is inside said memory.

17. The system of claim 14, wherein said memory is SRAM, MRAM, FeRAM, DRAM, SDRAM, ROM, EPROM or EEPROM.

* * * * *